(12) United States Patent
Hamada et al.

(10) Patent No.: US 8,604,126 B2
(45) Date of Patent: Dec. 10, 2013

(54) SILICONE RESIN COMPOSITION AND OPTICAL MATERIAL

(75) Inventors: Yoshitaka Hamada, Joetsu (JP); Kazuhiro Hirahara, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/350,228

(22) Filed: Jan. 13, 2012

(65) Prior Publication Data

US 2012/0184674 A1 Jul. 19, 2012

(30) Foreign Application Priority Data

Jan. 14, 2011 (JP) ................................. 2011-006288

(51) Int. Cl.
- *C08G 77/50* (2006.01)
- *C08K 9/00* (2006.01)
- *C08K 3/00* (2006.01)
- *C07F 7/08* (2006.01)
- *C08L 83/14* (2006.01)

(52) U.S. Cl.
USPC .............................. 524/858; 556/434; 528/35

(58) Field of Classification Search
None
See application file for complete search history.

(56) References Cited

U.S. PATENT DOCUMENTS

| | | | | |
|---|---|---|---|---|
| 3,109,826 A * | 11/1963 | Smith | ............................. | 528/15 |
| 3,684,793 A * | 8/1972 | Pepe et al. | ........................ | 528/18 |
| 5,622,782 A * | 4/1997 | Poutasse et al. | ............... | 428/344 |
| 5,998,925 A | 12/1999 | Shimizu et al. | | |
| 6,140,445 A * | 10/2000 | Su et al. | ............................. | 528/15 |
| 6,696,538 B2 * | 2/2004 | Ko et al. | ............................ | 528/34 |
| 6,808,251 B2 * | 10/2004 | Hiwatashi et al. | ............... | 347/47 |
| 6,864,006 B2 * | 3/2005 | Honma et al. | .................. | 429/492 |
| 6,881,697 B1 * | 4/2005 | Stocker | .......................... | 502/150 |
| 7,501,753 B2 | 3/2009 | Hancu et al. | | |
| 7,671,227 B2 * | 3/2010 | Dawes et al. | .................. | 556/465 |
| 7,855,043 B2 | 12/2010 | Ogihara et al. | | |
| 8,299,197 B2 * | 10/2012 | Woo et al. | ........................ | 528/28 |
| 2004/0109950 A1 * | 6/2004 | Adams et al. | .................. | 427/387 |
| 2006/0014845 A1 * | 1/2006 | Ree et al. | ........................ | 521/154 |
| 2006/0069171 A1 * | 3/2006 | Prokopowicz et al. | ......... | 521/61 |
| 2006/0142504 A1 * | 6/2006 | Ree et al. | ........................ | 525/342 |
| 2007/0173074 A1 * | 7/2007 | Ko et al. | ......................... | 438/790 |
| 2009/0148789 A1 * | 6/2009 | Amara et al. | ............... | 430/270.1 |
| 2009/0184313 A1 | 7/2009 | Buesing et al. | | |
| 2010/0040895 A1 | 2/2010 | Hamada et al. | | |
| 2010/0233482 A1 * | 9/2010 | Hamada et al. | ................ | 428/405 |
| 2010/0254856 A1 * | 10/2010 | Edmiston | ......................... | 422/69 |

FOREIGN PATENT DOCUMENTS

| | | |
|---|---|---|
| JP | 1-313528 A | 12/1989 |
| JP | 10-228249 A | 8/1998 |
| JP | 10-242513 A | 9/1998 |
| JP | 2000-123981 A | 4/2000 |
| JP | 2008-019423 A | 1/2008 |
| JP | 2008-546860 A | 12/2008 |
| JP | 2009-506195 A | 2/2009 |
| JP | 2009-538839 A | 11/2009 |
| JP | 2010-043211 A | 2/2010 |
| JP | 2010-513587 A | 4/2010 |
| JP | 2010-180323 A | 8/2010 |
| WO | WO 2006/134205 A | 12/2006 |
| WO | WO 2008/071850 A2 | 6/2008 |

OTHER PUBLICATIONS

Japanese Office Action for Japanese Application No. 2011-006288 dated Apr. 30, 2013.

* cited by examiner

*Primary Examiner* — Robert S Loewe
(74) *Attorney, Agent, or Firm* — Birch, Stewart, Kolasch & Birch, LLP

(57) ABSTRACT

A silicone resin composition is provided comprising a silicon base polymer obtained from dehydration reaction of a silicon base monomer comprising at least 70 mol % of a hydrolyzable silane compound (A). The hydrolyzable silane compound (A) has at least a pair of silicon atoms linked by a linking group which is an aliphatic hydrocarbon group or an aromatic ring-containing hydrocarbon group, and having attached thereto at least three substituent groups selected from hydrogen, hydroxyl and hydrolyzable groups. A proportion of aromatic structure-containing substituent groups is up to 30 mol % of the entire silicon-bonded substituent groups. The composition is suited to form an optical material.

6 Claims, 1 Drawing Sheet

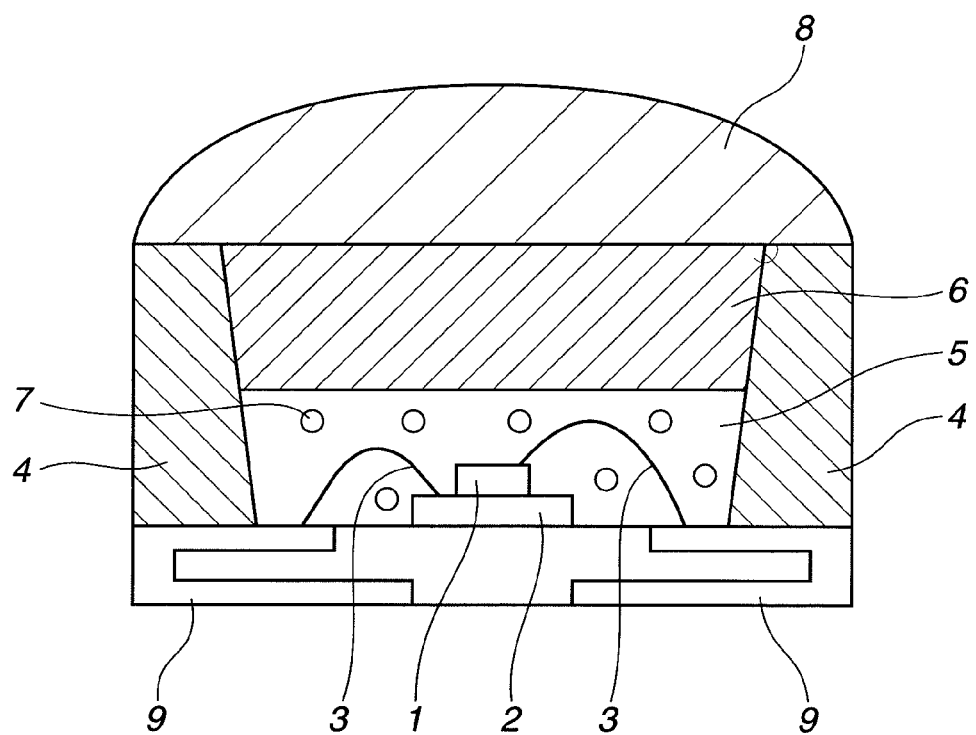

SILICONE RESIN COMPOSITION AND OPTICAL MATERIAL

CROSS-REFERENCE TO RELATED APPLICATION

This non-provisional application claims priority under 35 U.S.C. §119(a) on Patent Application No. 2011-006288 filed in Japan on Jan. 14, 2011, the entire contents of which are hereby incorporated by reference.

TECHNICAL FIELD

This invention relates to silicone resin compositions suitable for forming optical materials for use in optical devices and optical parts.

BACKGROUND ART

In the prior art, epoxy resins are commonly used as optical materials for use in optical devices and optical parts, typically encapsulating materials in light-emitting diode (LED) devices. Also, attempts are made to use silicone resins as molding material for LED devices (JP-A H10-228249 and JP-A H10-242513) and as color filter material (JP-A 2000-123981). In practice, few silicone resins are used.

Although the epoxy resins have several problems as encapsulant such as yellowing by UV or radiation, and cracking by an increased heat release associated with size reduction, these problems have not been considered serious. As white LEDs are recently of greater interest, it is urgently required to address the problems of epoxy resins. One approach is to use a silicone resin having a multiplicity of phenyl groups in the molecule as encapsulant (JP-A 2010-180323).

CITATION LIST

Patent Document 1: JP-A H10-228249
Patent Document 2: JP-A H10-242513
Patent Document 3: JP-A 2000-123981
Patent Document 4: JP-A 2010-180323
Patent Document 5: JP-A 2010-043211
Patent Document 6: JP-A 2008-019423
Patent Document 7: U.S. Pat. No. 7,501,753 (JP-A 2009-506195)
Patent Document 8: US 20090184313 (JP-A 2009-538839)

SUMMARY OF INVENTION

When prior art silicone resin compositions are to be cured, most often addition polymerization, typically hydrosilylation is utilized in order to provide for good moldability. See JP-A 2010-180323. However, a metal catalyst having a photoexcitation capability is often left in the cured silicone resin compositions. The residual catalyst is undesirable in the light-emitting device application where long-term light resistance is necessary.

To prevent the formation of cracks and defects by heat, a multiplicity of phenyl groups are introduced as the substituent group on silicon atom. However, cured silicone resin compositions containing a high concentration of phenyl groups have low resistance to stresses such as thermal shocks and low transparency in the ultraviolet region due to strong absorption of ultraviolet radiation, and sometimes give rise to a problem of light resistance during long-term service. In particular, visible light-emitting LED devices for use in illumination are designed such that LED emits light including the UV spectrum which is converted into visible light, suggesting that the degradation of optical material by UV is an outstanding problem.

Meanwhile, a silicon base polymer having an aliphatic group as substituent is prepared using a hydrolyzable mononuclear silane compound (or hydrolyzable silane compound having one silicon atom) as a main reactant. However, the silicon base polymer obtained from hydrolysis of such a hydrolyzable mononuclear silane compound is difficult to use as the optical material for the following reason. When a hydrolyzable silane compound having a functionality of at least 3 with respect to the hydrolyzable group is used as the main reactant, it is difficult to form a material having resistance to thermal stresses. On the other hand, when a difunctional hydrolyzable silane such as a dialkoxydialkylsilane is used, it forms, in part, a cyclic siloxane compound under high temperature conditions above 300° C., which compound separates from the resin, leading to a weight loss. These materials are difficult to use as the optical material which encounters significant temperature changes and is exposed to light at high temperature for a long term.

Therefore, an object of the invention is to provide a silicone resin composition and an optical material obtained by heat curing the composition, the optical material having high heat resistance, resistance to stresses such as thermal shocks, and improved light resistance.

The inventors have found that a silicone resin composition can be prepared using a silicon base polymer obtained from dehydration reaction of a silicon base monomer comprising a hydrolyzable polynuclear silane compound of a specific structure having a plurality of silicon atoms linked by linking groups, and that when the composition is molded through solvent removal or plastic deformation at a temperature below the cure temperature, and then heat cured, an optical material having high heat resistance, resistance to stresses such as thermal shocks, and improved light resistance is obtained while reducing thermal deformation thereof below the required level.

In one aspect, the invention provides an optical material-forming silicone resin composition comprising a silicon base polymer obtained from dehydration reaction of a silicon base monomer comprising a hydrolyzable silane compound (A). The hydrolyzable silane compound (A) has at least a pair of silicon atoms linked by a linking group which is a straight, branched or cyclic aliphatic hydrocarbon group of 1 to 6 carbon atoms or an aromatic ring-containing hydrocarbon group of 6 to 12 carbon atoms, the at least a pair of silicon atoms having attached thereto at least three substituent groups selected from hydrogen, hydroxyl and hydrolyzable groups, in total. The silicon base monomer contains at least 70 mol % on a silicon basis of the hydrolyzable silane compound (A). A proportion of aromatic structure-containing substituent groups in the substituent groups, inclusive of the linking group, on silicon atoms of the silicon base monomer is up to 30 mol % of the entire silicon-bonded substituent groups.

In a preferred embodiment, the silane compound having at least a pair of silicon atoms linked by a linking group which is an aliphatic hydrocarbon group or an aromatic ring-containing hydrocarbon group, to which at least three substituent groups selected from hydrogen atoms, hydroxyl groups and hydrolyzable groups, in total, are attached, has the general formula (1):

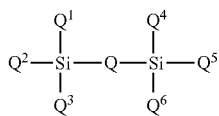

(1)

wherein Q is a divalent, straight, branched or cyclic aliphatic hydrocarbon group of 1 to 6 carbon atoms or a divalent aromatic ring-containing hydrocarbon group of 6 to 12 carbon atoms and; $Q^1$, $Q^2$, $Q^3$, $Q^4$, $Q^5$, and $Q^6$ are each independently hydrogen, halogen, hydroxyl, a straight, branched or cyclic alkoxy group of 1 to 10 carbon atoms, a straight, branched or cyclic alkyl group of 1 to 10 carbon atoms, or an aromatic ring-containing hydrocarbon group of 6 to 12 carbon atoms, at least one of $Q^1$, $Q^2$ and $Q^3$ and at least one of $Q^4$, $Q^5$ and $Q^6$ are selected from among hydrogen, halogen, hydroxyl, and a straight, branched or cyclic alkoxy group of 1 to 10 carbon atoms, and at least three of $Q^1$, $Q^2$, $Q^3$, $Q^4$, $Q^5$, and $Q^6$ are selected from among hydrogen, halogen, hydroxyl and a straight, branched or cyclic alkoxy group of 1 to 10 carbon atoms.

In a preferred embodiment, the silicon base polymer comprises recurring units having the general formula (2) in an amount of at least 70 mol % based on the entire recurring units of the polymer,

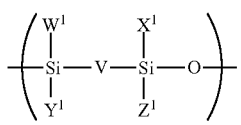

(2)

wherein V is a divalent, straight, branched or cyclic aliphatic hydrocarbon group of 1 to 6 carbon atoms or a divalent aromatic ring-containing hydrocarbon group of 6 to 12 carbon atoms; $W^1$, $X^1$, $Y^1$ and $Z^1$ are each independently hydrogen, halogen, hydroxyl, a straight, branched or cyclic alkoxy group of 1 to 10 carbon atoms, a straight, branched or cyclic alkyl group of 1 to 10 carbon atoms, a monovalent aromatic ring-containing hydrocarbon group of 6 to 12 carbon atoms, or an oxygen atom to constitute an Si—O—Si crosslink, at least one of $W^1$, $X^1$, $Y^1$ and $Z^1$ being selected from among hydrogen, halogen, hydroxyl, an alkoxy group, a monovalent aromatic ring-containing hydrocarbon group of 6 to 12 carbon atoms, and an oxygen atom to constitute an Si—O—Si crosslink, and not all $W^1$, $X^1$, $Y^1$ and $Z^1$ are an oxygen atom to constitute an Si—O—Si crosslink.

The silicone resin composition may further comprise an inorganic filler. Most often, the inorganic filler has been surface treated with a silylating agent or silane coupling agent.

An optical material obtained by heat curing the silicone resin composition defined above is also provided.

ADVANTAGEOUS EFFECTS OF INVENTION

The silicone resin composition eliminates a concern of siloxane contamination by thermal decomposition since the polymer is not based on a dialkylsiloxane chain, and cures into a product having high transparency, resistance to stresses such as thermal shocks, and improved heat and light resistance. The cured silicone resin composition finds use as the optical materials including material for protection, encapsulation, bonding, or wavelength conversion or adjustment of LED devices, lens material, encapsulant for optical devices and optical parts, and display material.

BRIEF DESCRIPTION OF DRAWING

The only figure, FIG. 1 is a schematic cross-sectional view of an LED lamp as one embodiment using an optical material of the invention.

DESCRIPTION OF EMBODIMENTS

One embodiment of the invention is an optical material-forming silicone resin composition comprising a silicon base polymer obtained from dehydration reaction of a silicon base monomer comprising a hydrolyzable silane compound (A). As used herein, the term "silicon base monomer" refers to a monomer capable of forming a condensate under sufficient conditions to effect hydrolysis and condensation of a hydrolyzable silane compound and generally embraces hydrolyzable silanes and silicates.

The hydrolyzable silane compound (A) included in the silicon base monomer, which is subject to dehydration reaction to form the silicon base polymer, is a silane compound having at least a pair of silicon atoms linked by a linking group which is a straight, branched or cyclic aliphatic hydrocarbon group of 1 to 6 carbon atoms or an aromatic ring-containing hydrocarbon group of 6 to 12 carbon atoms, wherein at least three substituent groups selected from hydrogen, hydroxyl and hydrolyzable groups, in total, are attached to the at least a pair of silicon atoms. The hydrolyzable silane compound (A) accounts for, on a silicon basis, at least 70 mol %, preferably at least 90 mol %, and most preferably all of the silicon base monomer. If the content of hydrolyzable silane compound (A) is less than 70 mol %, stress resistance such as thermal shock resistance characteristic of the invention may decline.

The at least a pair of silicon atoms may include two silicon atoms linked by the linking group, three or more silicon atoms linked via linking groups as a straight chain, and one silicon atom linked to three silicon atoms via linking groups. Also included is a chain of silicon atoms linked via linking groups in a straight chain structure which has a branch branched from a silicon atom in the chain and linked to a silicon atom not included in the straight chain via a linking group.

A proportion of aromatic structure-containing substituent groups is up to 30 mol % based on the entire substituent groups, inclusive of the linking groups in hydrolyzable silane compound (A), on silicon atoms of the silicon base monomer (which is subject to dehydration reaction to form the silicon base polymer). If a proportion of aromatic structure-containing substituent groups exceeds 30 mol % of the entire substituent groups, there is a risk of cracking due to shortage of stress resistance such as thermal shock resistance, yellowing with time, or a lowering of light resistance. As used herein, the term "substituent group" refers to an atom or group which is directly attached to a silicon atom, and in this sense, encompasses the linking group, but not the oxygen atom of a siloxane bond.

As defined above, the hydrolyzable silane compound (A) has at least a pair of silicon atoms linked by a linking group, with at least three substituent groups selected from hydrogen, hydroxyl and hydrolyzable groups being attached to the at least a pair of silicon atoms. The linking group for linking a pair of silicon atoms is a straight, branched or cyclic aliphatic hydrocarbon group of 1 to 6 carbon atoms or an aromatic ring-containing hydrocarbon group of 6 to 12 carbon atoms. The aliphatic hydrocarbon groups of 1 to 6 carbon atoms are preferably divalent groups and include, but are not limited to, methylene, dimethylene, trimethylene, tetramethylene, pentamethylene, and hexamethylene. The aromatic ring-containing hydrocarbon groups of 6 to 12 carbon atoms are preferably divalent groups and include, but are not limited to, phenylene, biphenylene, naphthylene, and xylylene. Of these, dimethylene and trimethylene are preferred as the linking group. A choice of such linking groups ensures a cured composition having satisfactory heat resistance, a low modulus of elasticity, and high stress resistance such as thermal shock resistance.

While the hydrolyzable silane compound (A) has at least a pair of silicon atoms linked by a linking group, with at least three substituent groups selected from hydrogen, hydroxyl and hydrolyzable groups being attached to the at least a pair of silicon atoms, the hydrolyzable group is typically a halogen atom or alkoxy group. The preferred alkoxy groups are straight, branched or cyclic aliphatic alkoxy groups of 1 to 10 carbon atoms. Preferred examples of the hydrolyzable group include, but are not limited to, chlorine, bromine, methoxy, ethoxy, propoxy, butoxy, pentyloxy, hexyloxy and structural isomers thereof, cyclopentyloxy, and cyclohexyloxy.

While the hydrolyzable silane compound (A) has at least a pair of silicon atoms linked by a linking group, with at least three substituent groups selected from hydrogen, hydroxyl and hydrolyzable groups being attached to the at least a pair of silicon atoms, any silicon atom in the silane compound may have as a side chain an organic group other than the hydrogen, hydroxyl and hydrolyzable group. Suitable organic groups include straight, branched or cyclic alkyl groups of 1 to 10 carbon atoms and aromatic ring-containing hydrocarbon groups of 6 to 12 carbon atoms. As used herein, the term "cyclic" may be either monocyclic or polycyclic. Preferred examples of the alkyl group include, but are not limited to, methyl, ethyl, propyl, butyl, pentyl, hexyl and structural isomers thereof, cyclopentyl, cyclohexyl, cycloheptyl, norbornyl, bicyclononyl, and decalinyl. Preferred examples of the aromatic ring-containing hydrocarbon group include, but are not limited to, phenyl, benzyl, 2-phenylethyl, naphthyl, naphthylmethyl, and 2-naphthylethyl. When an aromatic ring-containing hydrocarbon group is used, a cured product having a high refractive index may be obtained and shape stability during molding be enhanced. As alluded to previously, in order that the composition be effectively endowed with light resistance, a proportion of the aromatic ring-containing hydrocarbon group should be up to 30 mol % of the entire substituent groups, inclusive of the linking groups, on silicon atoms. Particularly when the polymer is designed to have enhanced resistance to UV, a proportion of the aromatic ring-containing hydrocarbon group should preferably be up to 20 mol %, and more preferably up to 10 mol %. A polymer substantially free of the aromatic ring-containing hydrocarbon group affords the highest light resistance.

Preferred examples of the silane compound having at least a pair of silicon atoms linked by a linking group, with at least three substituent groups selected from hydrogen, hydroxyl and hydrolyzable groups being attached to the at least a pair of silicon atoms, include hydrolyzable silane compounds having the general formulae (3) to (5).

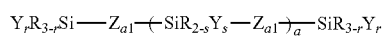
(3)

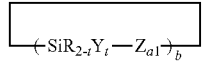
(4)

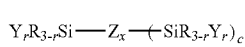
(5)

Herein, "a" is an integer of 1 to 20; r is each independently an integer of 1 to 3; s is an integer of 0 to 2, with the proviso that not all s's are 0 when all r's are 1; b is an integer of 2 to 6, and t is an integer of 0 to 2, with the proviso that not all t's are 0; c is an integer of 1 to 4, with the proviso that not all r's are 1 when c is 1. R is an optionally substituted, monovalent aliphatic hydrocarbon group of 1 to 12 carbon atoms or aromatic ring-containing hydrocarbon group. Y is each independently selected from hydrogen, hydroxyl, and alkoxy groups of 1 to 4 carbon atoms. $Z_{a1}$ is a divalent, straight, branched or cyclic aliphatic hydrocarbon group of 1 to 10 carbon atoms which may contain a cyclic structure. $Z_x$ is a (c+1)-valent, straight, branched or cyclic aliphatic hydrocarbon group of 1 to 10 carbon atoms which may contain a cyclic structure and in which a carbon-bonded hydrogen atom may be substituted by halogen or an alkoxy group of 1 to 6 carbon atoms, or a (c+1)-valent aromatic ring-containing hydrocarbon group of 6 to 12 carbon atoms.

While the silane compound is subjected to dehydration reaction to form a silicon base polymer, a silicon atom in direct bond to the linking group which is an aliphatic hydrocarbon group or aromatic ring-containing hydrocarbon group can be introduced into the polymer.

In formulae (3) and (4), $Z_{a1}$ is an aliphatic hydrocarbon group. Preferred examples of straight aliphatic hydrocarbon group include methylene, ethylene, propylene, butene, pentene, hexene and isomers thereof. Preferred examples of cyclic aliphatic hydrocarbon group include cyclopentane ring and cyclohexane ring, and a linking group having a cyclopentane or cyclohexane ring linked to a silicon atom via a methylene chain. $Z_x$ in formula (3) is preferably selected from aliphatic straight or cyclic hydrocarbon groups as exemplified for $Z_{a1}$ and aromatic ring-containing hydrocarbon groups such as benzene ring and a linking group having a benzene ring linked to a silicon atom via a dimethylene chain.

In formulae (3), (4) and (5), R is a monovalent aliphatic hydrocarbon group or aromatic ring-containing hydrocarbon group. Preferred examples of the monovalent aliphatic hydrocarbon group include methyl, ethyl, propyl, butyl, pentyl, hexyl, heptyl, octyl, nonyl, decanyl and isomers thereof, cyclopentyl, cyclohexyl, norbornyl, bicyclononyl, decalinyl, and adamantyl. Preferred examples of the aromatic ring-containing hydrocarbon group include phenyl, benzyl, 2-phenylethyl, naphthyl, naphthylmethyl, and 2-naphthylethyl. In these groups, some or all carbon-bonded hydrogen atoms may be substituted by halogen atoms such as fluorine and chlorine, or alkoxy groups of 1 to 6 carbon atoms.

For those compounds of formula (3) wherein at least one r is 2 or 3 and at least one s is 1 or 2, of formula (4) wherein at least two t's are 1 or 2, and of formula (5) wherein at least one r is 2 or 3, particularly high heat resistance is expectable.

It is noted that in JP-A 2010-043211, the inventors already proposed the silicon base polymer defined herein as a heat resistant adhesive. With respect to the use of a hydrolyzable mononuclear silane having one silicon atom, if a large amount of a tri or polyfunctional hydrolyzable silane is used, resistance to stresses such as thermal shocks is reduced; and if a large amount of a difunctional hydrolyzable silane is used, heat resistance is reduced as mentioned above. Then a silicon base polymer is designed so as to contain a large amount of recurring units in which silicon atoms are linked via a hydrocarbon group and which form at least three Si—O—Si bonds after heat curing. This design ensures a material that meets both heat resistance and resistance to stresses such as thermal shocks which are in a tradeoff relationship when a large amount of a hydrolyzable mononuclear silane is used. The material cures by the condensation mechanism that heat cure takes place while entailing removal of water or alcohol, obviates any problems with respect to shelf stability, transparency and cured properties even when loaded with a filler such as treated silica, and improves in molding and thixotropy. Even when it is desired to obtain a cured part having a thickness of at least 1 mm as optical material, the material can be molded into a molded part without any problems, clearing the necessary level with respect to heat distortion.

More preferred examples of the hydrolyzable silane compound having at least a pair of silicon atoms linked by a linking group which is an aliphatic hydrocarbon or aromatic ring-containing hydrocarbon group, with at least three substituent groups selected from hydrogen, hydroxyl and hydrolyzable groups being attached to the at least a pair of silicon atoms, (which silane compound is preferably used in dehydration reaction to form the silicon base polymer), include silane compounds having the general formula (1).

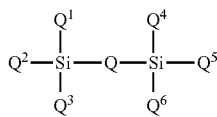

(1)

Herein Q is a divalent, straight, branched or cyclic aliphatic hydrocarbon group of 1 to 6 carbon atoms or a divalent aromatic ring-containing hydrocarbon group of 6 to 12 carbon atoms; $Q^1, Q^2, Q^3, Q^4, Q^5$, and $Q^6$ are each independently hydrogen, halogen, hydroxyl, a straight, branched or cyclic alkoxy group of 1 to 10 carbon atoms, a straight, branched or cyclic alkyl group of 1 to 10 carbon atoms, or an aromatic ring-containing hydrocarbon group of 6 to 12 carbon atoms, at least one of $Q^1, Q^2$ and $Q^3$ and at least one of $Q^4, Q^5$ and $Q^6$ are selected from among hydrogen, halogen, hydroxyl, and a straight, branched or cyclic alkoxy group of 1 to 10 carbon atoms, and at least three of $Q^1, Q^2, Q^3, Q^4, Q^5$, and $Q^6$ are selected from among hydrogen, halogen, hydroxyl and a straight, branched or cyclic alkoxy group of 1 to 10 carbon atoms.

In formula (1), Q is a divalent, straight, branched or cyclic aliphatic hydrocarbon group of 1 to 6 carbon atoms or a divalent aromatic ring-containing hydrocarbon group of 6 to 12 carbon atoms. Examples of the divalent aliphatic hydrocarbon group of 1 to 6 carbon atoms include, but are not limited to, methylene, dimethylene, trimethylene, tetramethylene, pentamethylene, and hexamethylene. Examples of the divalent aromatic ring-containing hydrocarbon group of 6 to 12 carbon atoms include, but are not limited to, phenylene, biphenylene, naphthylene, and xylylene. Preferably Q is selected from divalent straight aliphatic hydrocarbon groups of 1 to 6 carbon atoms because high resistance to stresses such as thermal shocks is achievable by such selection.

In formula (1), $Q^1, Q^2, Q^3, Q^4, Q^5$, and $Q^6$ are each independently selected from among hydrogen, halogen, hydroxyl, a straight, branched or cyclic alkoxy group of 1 to 10 carbon atoms, a straight, branched or cyclic alkyl group of 1 to 10 carbon atoms, and an aromatic ring-containing hydrocarbon group of 6 to 12 carbon atoms. Non-limiting examples of the alkoxy group include methoxy, ethoxy, propoxy, butoxy, pentyloxy, hexyloxy and structural isomers thereof, cyclopentyl, and cyclohexyl. Non-limiting examples of the straight, branched or cyclic alkyl group of 1 to 10 carbon atoms include methyl, ethyl, propyl, butyl, pentyl, hexyl and structural isomers thereof, cyclopentyl, cyclohexyl, cycloheptyl, norbornyl, bicyclononyl, decalinyl, and adamantyl. Non-limiting examples of the aromatic ring-containing hydrocarbon group of 6 to 12 carbon atoms include phenyl, benzyl, 2-phenylethyl, naphthyl, naphthylmethyl, 2-naphthylethyl, toluyl, xylyl, and mesityl.

It is noted that at least one of $Q^1, Q^2$ and $Q^3$ and at least one of $Q^4, Q^5$ and $Q^6$ are selected from among hydrogen, halogen, hydroxyl, and a straight, branched or cyclic alkoxy group of 1 to 10 carbon atoms, and at least three of $Q^1, Q^2, Q^3, Q^4, Q^5$, and $Q^6$ are selected from among hydrogen, halogen, hydroxyl and a straight, branched or cyclic alkoxy group of 1 to 10 carbon atoms. With this selection, the linking unit represented by Q can be incorporated into the main chain of the silicon base polymer obtained from dehydration reaction of the hydrolyzable silane compound of formula (1).

In the practice of the invention, the hydrolyzable silane compound (A) may be used alone or in admixture of two or more.

Preferred examples of the hydrolyzable silane compound having formula (1) include
1,2-bis(methyldimethoxysilyl)ethane,
1-(methyldimethoxysilyl)-2-(dimethylmethoxysilyl)ethane,
1,3-bis(methyldimethoxysilyl)propane,
1-(methyldimethoxysilyl)-3-(dimethylmethoxysilyl)propane,
1,4-bis(methyldimethoxysilyl)butane,
1-(methyldimethoxysilyl)-4-(trimethoxysilyl)butane,
1,5-bis(methyldimethoxysilyl)pentane,
1-(methyldimethoxysilyl)-5-(trimethoxysilyl)pentane,
1,6-bis(methyldimethoxysilyl)hexane,
1-(methyldimethoxysilyl)-6-(trimethoxysilyl)hexane,
1,6-bis(trimethoxysilyl)hexane,
1,2-bis(methyldimethoxysilyl)benzene,
1,3-bis(methyldimethoxysilyl)benzene,
1,4-bis(methyldimethoxysilyl)benzene, and
those exemplary compounds in which the methoxy group is replaced by an ethoxy, propoxy, butoxy or alkyl isomer thereof, or hydrogen.

As the silicon base monomer, hydrolyzable silane compounds other than the foregoing may be used, the other hydrolyzable silane compound being referred to as hydrolyzable silane compound (B) for discrimination purposes. The hydrolyzable silane compound (B) is typically a hydrolyzable silane compound having one silicon atom, and specifically a hydrolyzable silane compound having the general formula (6):

$$R_n SiL_{4-n} \qquad (6)$$

wherein R is an optionally substituted, monovalent aliphatic hydrocarbon group of 1 to 12 carbon atoms or aromatic ring-containing hydrocarbon group, L is hydrogen, halogen, hydroxyl, or a straight, branched or cyclic alkoxy group of 1 to 10 carbon atoms, and n is an integer of 0 to 2.

Preferred examples of the group represented by R in formula (6) include the same as exemplified above for R in formulae (3) to (5). Of the groups represented by L, preferred examples of the alkoxy groups include the same as exemplified above for $Q^1, Q^2, Q^3, Q^4, Q^5$, and $Q^6$.

In order that the inventive material have the desired thermal properties, the hydrolyzable silane compound (B) should preferably be used in an amount of up to 30 mol %, more preferably up to 10 mol % of the overall silicon base monomer. If the amount of hydrolyzable silane compound (B) exceeds 30 mol %, a tendency to lose resistance to stresses such as thermal shocks may appear in the case of compound (B) of formula (6) wherein n is 0 or 1, and heat resistance may decline in the case of compound (B) of formula (6) wherein n is 2.

On hydrolysis of the silicon base monomer containing the hydrolyzable silane compound or compounds defined above, there is obtained a silicon base polymer which is used in the silicone resin composition of the invention. The silicon base polymer preferably comprises recurring units having the general formula (2).

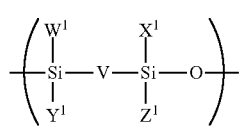
(2)

Herein V is a divalent, straight, branched or cyclic aliphatic hydrocarbon group of 1 to 6 carbon atoms or a divalent aromatic ring-containing hydrocarbon group of 6 to 12 carbon atoms. $W^1$, $X^1$, $Y^1$ and $Z^1$ are each independently hydrogen, halogen, hydroxyl, a straight, branched or cyclic alkoxy group of 1 to 10 carbon atoms, a straight, branched or cyclic alkyl group of 1 to 10 carbon atoms, a monovalent aromatic ring-containing hydrocarbon group of 6 to 12 carbon atoms, or an oxygen atom to constitute an Si—O—Si crosslink; at least one of $W^1$, $X^1$, $Y^1$ and $Z^1$ is selected from among hydrogen, halogen, hydroxyl, an alkoxy group, and an oxygen atom to constitute an Si—O—Si crosslink, and not all $W^1$, $X^1$, $Y^1$ and $Z^1$ are an oxygen atom to constitute an Si—O—Si crosslink. The recurring units having formula (2) are present in an amount of at least 70 mol % based on the entire recurring units of the polymer. The content of aromatic ring-containing hydrocarbon group in the silicon base polymer should be up to 30 mol %, preferably up to 20 mol %, and most preferably 0 mol %, based on the entire silicon-bonded substituent groups excluding the oxygen atom of a siloxane bond (the substituent groups including the linking group V). Using the silicone resin composition comprising the silicon base polymer defined herein, an optical material having higher heat resistance, resistance to stresses such as thermal shocks, and light resistance may be obtained.

Referring to formula (2), V is a divalent, straight, branched or cyclic aliphatic hydrocarbon group of 1 to 6 carbon atoms or a divalent aromatic ring-containing hydrocarbon group of 6 to 12 carbon atoms, with the divalent straight aliphatic hydrocarbon group of 1 to 6 carbon atoms being preferred. Examples of V include, but are not limited to, methylene, dimethylene, trimethylene, tetramethylene, pentamethylene, hexamethylene, phenylene, biphenylene, naphthylene, and xylylene, with methylene, dimethylene, trimethylene, tetramethylene, pentamethylene, and hexamethylene being preferred.

In the recurring unit of formula (2), $W^1$, $X^1$, $Y^1$ and $Z^1$ are each independently hydrogen, halogen, hydroxyl, a straight, branched or cyclic alkoxy group of 1 to 10 carbon atoms, a straight, branched or cyclic alkyl group of 1 to 10 carbon atoms, a monovalent aromatic ring-containing hydrocarbon group of 6 to 12 carbon atoms, or an oxygen atom to constitute an Si—O—Si crosslink. Preferred examples of the alkoxy group which can be selected as $W^1$, $X^1$, $Y^1$ and $Z^1$ include, but are not limited to, methoxy, ethoxy, propoxy, butoxy, pentyloxy, hexyloxy and structural isomers thereof, cyclopentyloxy, and cyclohexyloxy. Preferred examples of the alkyl group which can be selected as $W^1$, $X^1$, $Y^1$ and $Z^1$ include, but are not limited to, methyl, ethyl, propyl, butyl, pentyl, hexyl and structural isomers thereof, cyclopentyl, cyclohexyl, cycloheptyl, norbornyl, bicyclononyl, decalinyl, and adamantyl. Preferred examples of the monovalent aromatic ring-containing hydrocarbon group of 6 to 12 carbon atoms include, but are not limited to, phenyl, benzyl, 2-phenylethyl, naphthyl, naphthylmethyl, 2-naphthylethyl, toluyl, xylyl, and mesityl.

The silicon base polymer for use in the silicone resin composition may suffer from drawbacks if the recurring units of the polymer have too high a degree of crosslinking, the drawbacks including poor solvent solubility, difficulty to use, and a loss of plasticity during molding. For this reason, not all $W^1$, $X^1$, $Y^1$ and $Z^1$ are an oxygen atom to constitute an Si—O—Si crosslink. Preferably $W^1$, $X^1$, $Y^1$ and $Z^1$ are selected such that at least one of $W^1$ and $Y^1$ and at least one of $X^1$ and $Z^1$ are hydrogen, halogen, hydroxyl, a straight, branched or cyclic alkoxy group of 1 to 10 carbon atoms, or an oxygen atom to constitute an Si—O—Si crosslink, and three or less of $W^1$, $X^1$, $Y^1$ and $Z^1$ are hydrogen, halogen, hydroxyl, a straight, branched or cyclic alkoxy group of 1 to 10 carbon atoms, or an oxygen atom to constitute an Si—O—Si crosslink.

The silicone resin composition comprising the silicon base polymer comprising the recurring units having formula (2) in an amount of at least 70 mol % based on the entire recurring units of the polymer affords an optical material having high heat resistance, resistance to stresses such as thermal shocks, and improved light resistance.

Preferred examples of the recurring unit having formula (2) to constitute the silicon base polymer are shown below.

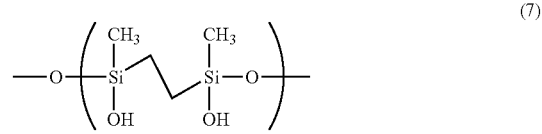
(7)

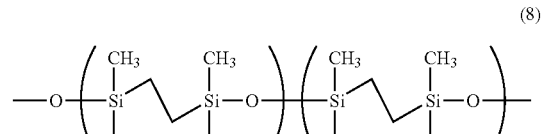
(8)

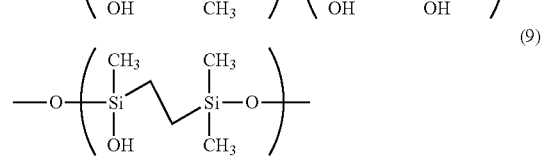
(9)

Where the recurring unit of formula (2) is a recurring unit of formula (7), the material becomes the hardest among the recurring units of formulae (7) to (9). Where the recurring unit of formula (2) is a recurring unit of formula (9), the material becomes most resistant to stresses by thermal shocks. Where the recurring unit of formula (2) is a recurring unit of formula (8), the desired characteristics may be obtained by adjusting a proportion of the recurring unit containing one hydroxyl group and the recurring unit containing two hydroxyl groups so as to adjust the physical properties listed above.

In addition to the recurring units of formula (2), the silicon base polymer may further comprise other recurring units. The other recurring units include, for example, recurring units derived from a hydrolyzable silane compound having one silicon atom as represented by formula (6).

In order that the material of the invention have the desired thermal properties, the content of the other recurring units should preferably be up to 30 mol%, more preferably up to 10 mol%, based on the entire recurring units. If the content of the other recurring units exceeds 30 mol%, a tendency to lose resistance to stresses such as thermal shocks may appear where the recurring units are derived from hydrolyzable silane compound (B) of formula (6) wherein n is 0 or 1, and heat resistance may decline where the recurring units are derived from hydrolyzable silane compound (B) of formula (6) wherein n is 2.

The silicon base polymer resulting from dehydration reaction of hydrolyzable silane compound or compounds should preferably have a weight average molecular weight (Mw) of 100 to 1,000,000, more preferably 500 to 5,000 as measured by gel permeation chromatography (GPC) versus polystyrene standards.

The silicon base polymer may be obtained by selecting proper one or more from the foregoing hydrolyzable silane compounds as the silicon base monomer, and subjecting one silane compound or a mixture of silane compounds to hydrolysis and condensation in the presence of an acid or basic catalyst. With respect to the hydrolysis and condensation of hydrolyzable silane compounds, a number of methods are known in the art, for example, from JP-A 2008-019423, and any of known methods may be used herein. A basic catalyst is preferably used in order to form a Si—O—Si bond from a Si—H bond, although another approach intended to control the condensation state involving the steps of retaining Si—H bond until sintering and converting Si—H bond to Si—O—Si bond during sintering is possible.

Examples of the acid catalyst which can be used herein include inorganic acids such as hydrofluoric acid, hydrochloric acid, hydrobromic acid, sulfuric acid, nitric acid, perchloric acid, and phosphoric acid, sulfonic acid derivatives such as methanesulfonic acid, benzenesulfonic acid, toluenesulfonic acid, and trifluoromethanesulfonic acid, and organic acids having a relatively high acidity such as oxalic acid and maleic acid. When used, the acid catalyst is present in an amount of $10^{-6}$ to 10 moles, preferably $10^{-5}$ to 5 moles, and more preferably $10^{-4}$ to 1 mole per mole of silicon atoms in the entire silicon base monomer.

In the presence of the acid catalyst, water is added for dehydration reaction of the hydrolyzable silane compounds to produce the silicon base polymer, preferably in an amount of 0.01 to 100 moles, more preferably 0.05 to 50 moles, and even more preferably 0.1 to 30 moles per mole of hydrolyzable substituent groups on the hydrolyzable silane compounds. The addition of more than 100 moles of water may be uneconomical because a reactor of large volume is necessary.

The reaction procedure is by adding the hydrolyzable silane compound(s) to an aqueous solution of acid catalyst to initiate dehydration reaction. At this point, an organic solvent may have been added to the aqueous solution of acid catalyst, and/or the hydrolyzable silane compound may have been diluted with an organic solvent. The reaction temperature is 0 to 100° C., preferably 5 to 80° C. In the preferred procedure, the hydrolyzable silane compound is added dropwise at a temperature of 5 to 80° C., followed by reaction at 20 to 80° C.

Examples of the organic solvent which can be added to the aqueous solution of acid catalyst and with which the hydrolyzable silane compound can be diluted include methanol, ethanol, 1-propanol, 2-propanol, 1-butanol, 2-butanol, 2-methyl-l-propanol, acetone, acetonitrile, tetrahydrofuran, toluene, hexane, ethyl acetate, cyclohexanone, methyl-2-n-amyl ketone, 4-methyl-2-pentanone, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures thereof.

Of these solvents, water-soluble ones are preferred. Suitable water-soluble solvents include alcohols such as methanol, ethanol, 1-propanol and 2-propanol, polyhydric alcohols such as ethylene glycol and propylene glycol, polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, and ethylene glycol monopropyl ether, acetone, 4-methyl-2-pentanone, acetonitrile, and tetrahydrofuran. Those water-soluble solvents having a boiling point of up to 100° C. are more preferred.

In the presence of the acid catalyst, the organic solvent is preferably used in an amount of 0 to 1,000 mL, more preferably 0 to 500 mL per mole of the hydrolyzable silane compound. An excess of the organic solvent may be uneconomical because a reactor of large volume is necessary.

In the other mode of dehydration reaction, a basic catalyst is used. Examples of the basic catalyst include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. When used, the basic catalyst is present in an amount of $10^{-6}$ to 10 moles, preferably $10^{-5}$ to 5 moles, and more preferably $10^{-4}$ to 1 mole per mole of the entire silicon base monomer.

In the presence of the basic catalyst, water is added for dehydration reaction of the hydrolyzable silane compounds to produce the silicon base polymer, preferably in an amount of 0.1 to 100 moles, more preferably 0.3 to 50 moles, and even more preferably 0.5 to 30 moles per mole of hydrolyzable substituent groups on the hydrolyzable silane compounds. The addition of more than 100 moles of water may be uneconomical because a reactor of large volume is necessary for the reaction.

The reaction procedure is by adding the hydrolyzable silane compound(s) to an aqueous solution of basic catalyst to initiate dehydration reaction. At this point, an organic solvent may have been added to the aqueous solution of basic catalyst, and/or the hydrolyzable silane compound may have been diluted with an organic solvent. The reaction temperature is 0 to 100° C., preferably 5 to 80° C. In the preferred procedure, the hydrolyzable silane compound is added dropwise at a temperature of 5 to 80° C., followed by reaction at 20 to 80° C.

Examples of the organic solvent which can be added to the aqueous solution of basic catalyst and with which the hydrolyzable silane compound can be diluted include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amyl ketone, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures thereof.

Of these solvents, water-soluble ones are preferred. Suitable water-soluble solvents include alcohols such as methanol, ethanol, 1-propanol and 2-propanol, polyhydric alcohols such as ethylene glycol and propylene glycol, polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, and ethylene glycol monopropyl ether, acetone, acetonitrile, and tetrahydrofuran. Those water-soluble solvents having a boiling point of up to 100° C. are more preferred.

In the presence of the basic catalyst, the organic solvent is preferably used in an amount of 0 to 1,000 mL, more preferably 0 to 500 mL per mole of the hydrolyzable silane compound. An excess of the organic solvent may be uneconomical because a reactor of large volume is necessary.

Thereafter, neutralization reaction of the catalyst is carried out if necessary, and the alcohol formed during dehydration reaction is removed in vacuum, leaving the reaction mixture in aqueous solution form. An amount of an acidic substance used for neutralization is preferably 0.1 to 2 equivalents relative to the base used as the catalyst. Any acidic substance may be used as long as it displays acidity in water.

The silicon resin composition of the invention may further comprise a solvent capable of dissolving the silicon base polymer. Examples of suitable solvents include alcohols such as methanol, ethanol, propanol, 2-propanol (IPA), and butanol; ethers such as tetrahydrofuran (THF), methyl tert-butyl ether (MTBE), cyclopentyl methyl ether (CPME), butyl ether, propylene glycol monoethyl ether (PGEE), and propylene glycol monopropyl ether (PnP); ketones such as acetone, methyl isobutyl ketone (MIBK) and cyclohexanone; esters such as ethyl acetate, butyl acetate, ethyl lactate (EL), propylene glycol monomethyl ether acetate (PGMEA), and lactones such as γ-butyrolactone.

When the silicon resin composition is prepared, a proportion of the silicon base polymer and the solvent may be adjusted depending on a particular application. For example, when a composition to be coated to form a film is prepared, the proportion is preferably adjusted to a concentration of 1 to 50% by weight of the silicon base polymer. When a shaping procedure of plastically deforming the composition into a desired shape and then curing is employed, the proportion is preferably adjusted to a concentration of at least 30% by weight of the silicon base polymer although the exact concentration varies with a particular silicon base polymer. In a certain embodiment, a substantially solvent-free composition is acceptable.

The silicone resin composition may further comprise an inorganic filler. Suitable inorganic fillers include ground quartz, zeolite, silica, alumina, and talc. The inorganic filler may have been surface treated in order to be fully compatible with the silicon base polymer. A typical surface treatment for improving compatibility with the silicon base polymer is treatment with a silylating agent or silane coupling agent. Numerous examples of the silylating agent and silane coupling agent are known in the art and any of them may be used. Examples include alkylsilanes, vinylsilanes, methacrylsilanes, epoxy silanes, mercaptosilanes, sulfur silanes, aminosilanes, ureidosilanes, and isocyanate silanes, all having a hydrolyzable group. Treatment may be carried out by any general techniques, for example, a dry technique of spraying or otherwise applying, and a wet technique of dispersing the inorganic filler in a solvent.

The inorganic filler may be added in an amount of up to 1,000 parts by weight per 100 parts by weight of the silicon base polymer. The amount of the inorganic filler is preferably up to 100 parts by weight for obtaining a composition which is as uniform as possible, and more preferably up to 50 parts by weight because better moldability and higher light transmission are available. Mixing of the inorganic filler and the silicon base polymer may be carried out by adding the inorganic filler to a solution of the silicon base polymer in an organic solvent and mixing, or by heating and melting the silicon base polymer at a temperature below the cure temperature, adding the inorganic filler to the melt, mixing and kneading.

Like the inorganic filler, an inorganic or organic substance having luminescence for converting UV to visible light may be added to the silicone resin composition. Numerous luminescent substances are known in the art, including inorganic substances as disclosed in U.S. Pat. No. 7,501,753 and organic substances as disclosed in US 20090184313.

From the silicone resin composition of the invention, a cured product may be obtained in several ways. In case the composition contains a solvent, a cured product may be obtained by coating the composition onto a substrate or casting the composition into an open top mold, volatilizing off the solvent, and firing. For solvent removal, the composition is kept at a temperature below 200° C., at which the solvent gradually volatilizes off and dehydration condensation takes place at the same time, whereby a general shape is determined. Preferably this is followed by firing at a temperature of at least 250° C. The open top mold may be a metal mold such as an evaporating dish of aluminum.

In case the composition is solventless, a cured product may be obtained by heating the composition at a temperature of 50 to 200° C. so that the composition may flow, and casting it into a mold where dehydration condensation takes place slowly. Also preferably this is followed by sintering at a temperature of at least 250° C.

Where it is desired to form a cured product tenaciously bonded to a substrate, the goal may be achieved by coating the composition onto a substrate to form a thin coating, firing the coating at a temperature of at least 250° C. to form a cured thin film, attaching a cured product precursor which has been cast into a mold and B-staged thereto, and firing. Since the gas generated by crosslinking reaction penetrates and exits through the thin film during the last firing, the problem of peeling by the gas generated during curing can be avoided.

From the silicone resin composition of the invention, an optical material may be obtained by the above-described methods or the like. The resulting optical material has high transparency, high heat resistance, resistance to stresses such as thermal shocks, and resistance to photo-degradation like yellowing. Even after reaction at 400° C., the optical material is free of a weight loss due to volatilization of a low molecular weight fraction. The cured silicone resin composition finds use as the optical materials including encapsulants for optical devices, especially LEDs, and optical lens, especially for UV-containing light.

FIG. 1 schematically illustrates an LED lamp as one embodiment using the optical material of the invention. The lamp includes an LED chip 1, a die bond 2, leads 3, a package 4, a buffer layer 5, an encapsulant 6, phosphor material 7, a lens 8, and electrodes 9. The optical material is typically used as the encapsulant 6 while it may also be used as the lens 8.

EXAMPLE

Synthesis Examples, Examples and Comparative Examples are given below for further illustrating the invention although the invention is not limited thereto. It is noted that Mw stands for weight average molecular weight and GPC for gel permeation chromatography.

Synthesis Example 1

Preparation of Silicon Base Polymer BSE-4

A 100-ml flask was charged with 26.8 g of 0.001N dilute nitric acid. With stirring, a mixture of 12.3 g of 1,2-bis(methyldimethoxysilyl)ethane and 1.6 g of methyl isobutyl ketone (MIBK) was added to the flask, followed by stirring overnight at room temperature. MIBK, 14.5 g, was added to the reaction solution, which was subjected to separatory operation. Ethyl acetate, 25 g, was added to the organic phase, which was washed with ultrapure water until the extract water became neutral. Subsequent dehydration and concentration on an evaporator yielded a solution of silicon base polymer BSE-4.

When a sample (about 1 g) of the solution was weighed in an aluminum dish and heated in an oven at 160° C. for 1 hour, the residue or nonvolatile (NV) content was 36%. Silicon base polymer BSE-4 had a Mw of 2,050 as measured by GPC versus polystyrene standards.

Synthesis Example 2

Preparation of Silicon Base Polymer BSE-34

A 100-ml flask was charged with 26.8 g of 0.001N dilute nitric acid. With stirring, a mixture of 6.1 g of 1,2-bis(methyldimethoxysilyl)ethane, 5.7 g of 1-(methyldimethoxysilyl)-2-(dimethylmethoxysilyl)ethane, and 1.6 g of MIBK was added to the flask, followed by stirring overnight at room temperature. The reaction solution was then worked up as in Synthesis Example 1, yielding a solution of silicon base polymer BSE-34. The solution had a NV content of 38%. Silicon base polymer BSE-4 had a Mw of 1,850 as measured by GPC versus polystyrene standards.

Synthesis Example 3

Preparation of Silicon Base Polymer BSE-4c

A portion (10 g) of the BSE-4 solution in Synthesis Example 1 was weighed and concentrated on an evaporator to about 60%, obtaining BSE-4c. The concentration resulted in a NV content of 68%.

Synthesis Example 4

Preparation of Silicon Base Polymer BSE-34c

A portion (10 g) of the BSE-34 solution in Synthesis Example 2 was weighed and concentrated on an evaporator to about 60%, obtaining BSE-34c. The concentration resulted in a NV content of 66%.

Synthesis Example 5

Preparation of Silicon Base Polymer QT5050

A 100-ml flask was charged with 26.8 g of 0.001N dilute nitric acid. With stirring, a mixture of 7.8 g of tetramethoxysilane, 7.0 g of methyltrimethoxysilane, and 1.6 g of MIBK was added to the flask, followed by stirring overnight at room temperature. MIBK, 14.5 g, was added to the reaction solution, which was subjected to separatory operation. Ethyl acetate, 25 g, was added to the organic phase, which was washed with ultrapure water until the extract water became neutral. Subsequent dehydration and concentration on an evaporator yielded a solution of silicon base polymer QT5050.

When a sample (about 1 g) of the solution was weighed in an aluminum dish and heated in an oven at 160° C. for 1 hour, the nonvolatile (NV) content was 34%. Silicon base polymer QT5050 had a Mw of 1,900 as measured by GPC versus polystyrene standards.

Examples 1 to 16

From portions (corresponding to a NV content of 0.5 g) of the silicon base polymer solutions prepared in Synthesis Examples 1 to 4, compositions of Examples 1 to 16 as shown in Table 1 were prepared by adding 0 wt %, 10 wt %, 20 wt % or 50 wt % of surface treated silica (MSR-8000, Tatsumori, Ltd.) thereto and mixing. Note that 0 wt % means that silica was not added. Each composition was placed in an aluminum dish and fired in air at 160° C. in a natural convection thermostat dryer. Sample pieces were arrayed on a silicon wafer and fired at 400° C. in a nitrogen stream using an IR lamp heating system RTP-6 (ULVAC-Riko, Inc.). The cured samples after firing were visually observed for outer appearance, with the results also shown in Table 1.

TABLE 1

| Example | Silicon base polymer solution, g | Silica, g | Firing @ 160° C./ 2 hr | Firing @ 400° C./ 10 min |
|---|---|---|---|---|
| 1 | BSE-4 (1.39 g) | — | colorless, transparent | — |
| 2 | BSE-4 (1.39 g) | MSR-8000 (0.05 g) | colorless, transparent | — |
| 3 | BSE-4 (1.39 g) | MSR-8000 (0.1 g) | translucent | — |
| 4 | BSE-4 (1.39 g) | MSR-8000 (0.25 g) | translucent | — |
| 5 | BSE-34 (1.32 g) | — | colorless, transparent | — |
| 6 | BSE-34 (1.32 g) | MSR-8000 (0.05 g) | colorless, transparent | — |
| 7 | BSE-34 (1.32 g) | MSR-8000 (0.1 g) | translucent | — |
| 8 | BSE-34 (1.32 g) | MSR-8000 (0.25 g) | translucent | — |
| 9 | BSE-4c (0.74 g) | — | colorless, transparent | colorless, transparent |
| 10 | BSE-4c (0.74 g) | MSR-8000 (0.05 g) | colorless, transparent | translucent |
| 11 | BSE-4c (0.74 g) | MSR-8000 (0.1 g) | translucent | translucent |
| 12 | BSE-4c (0.74 g) | MSR-8000 (0.25 g) | translucent | translucent |
| 13 | BSE-34c (0.76 g) | — | colorless, transparent | colorless, transparent |
| 14 | BSE-34c (0.76 g) | MSR-8000 (0.05 g) | colorless, transparent | translucent |
| 15 | BSE-34c (0.76 g) | MSR-8000 (0.1 g) | translucent | translucent |
| 16 | BSE-34c (0.76 g) | MSR-8000 (0.25 g) | translucent | translucent |

As seen from Table 1, all the silicon base polymer solutions remained fully miscible with the inorganic filler until the amount of silica reached 50 parts by weight relative to 100 parts by weight of net silicon base polymer content. By firing at 160° C., transparent or translucent cured products were formed. On further firing at 400° C., the cured products remained unchanged in outer appearance. The silica-free cured products of Examples 9 and 13 showed slight drops of mechanical strength after firing at 400° C., whereas the silica-laden cured products of Examples 10 to 12 and 14 to 16 maintained shape and strength even after firing at 400° C.

Comparative Examples 1 to 8

From a portion (corresponding to a NV content of 0.5 g) of the silicon base polymer solution prepared in Synthesis Example 5, compositions of Comparative Examples 1 to 8 as shown in Table 2 were prepared by adding 0 wt %, 10 wt %, 20 wt % or 50 wt % of surface treated silica (MSR-8000, Tatsumori Co., Ltd.) thereto and mixing.

Comparative Examples 9 to 12

Compositions of Comparative Examples 9 to 12 as shown in Table 2 were prepared by mixing 0.5 g of RF Oil (polydimethylsiloxane) having a Mw of 20,000 with 25 mg of dibutyltin dilaurate, adding 0 wt % or 20 wt % of surface treated silica (MSR-8000, Tatsumori, Ltd.) to the mixture and mixing.

Comparative Examples 13 to 16

Compositions of Comparative Examples 13 to 16 as shown in Table 2 were prepared by mixing 0.5 g of a SiH-terminated oil (polydimethylsiloxane capped at either end with dimethylhydrosilane) having a Mw of 2,000, 0.02 g of hexavinyldisiloxane, and a catalytic amount of a platinum catalyst, adding 0 wt % or 20 wt % of surface treated silica (MSR-8000, Tatsumori, Ltd.) to the mixture and mixing. As in Examples, each composition was placed in an aluminum dish and fired in air at 160° C. in a natural convection thermostat dryer. Sample pieces were arrayed on a silicon wafer and fired at 400° C. in a nitrogen stream using an IR lamp heating system RTP-6 (ULVAC-Riko, Inc.). The cured samples after firing were visually observed for outer appearance, with the results also shown in Table 2.

TABLE 2

| Comparative Example | Main component, g | Silica, g | Firing @ 160° C./ 2 hr | Firing @ 400° C./ 10 min |
|---|---|---|---|---|
| 1 | QT5050 (1.47 g) | — | colorless, transparent | — |
| 2 | QT5050 (1.47 g) | MSR-8000 (0.05 g) | colorless, transparent | — |
| 3 | QT5050 (1.47 g) | MSR-8000 (0.1 g) | translucent | — |
| 4 | QT5050 (1.47 g) | MSR-8000 (0.25 g) | translucent | — |
| 5 | QT5050 (1.47 g) | — | colorless, transparent | white turbid, crazing |
| 6 | QT5050 (1.47 g) | MSR-8000 (0.05 g) | colorless, transparent | white turbid, crazing |
| 7 | QT5050 (1.47 g) | MSR-8000 (0.1 g) | translucent | white turbid, crazing |
| 8 | QT5050 (1.47 g) | MSR-8000 (0.25 g) | translucent | white turbid, crazing |
| 9 | RF Oil | — | undercure | — |
| 10 | RF Oil | MSR-8000 (0.1 g) | colorless, transparent | — |
| 11 | RF Oil | — | colorless, transparent | white turbid, deformed |
| 12 | RF Oil | MSR-8000 (0.1 g) | colorless, transparent | white turbid, crazing |
| 13 | SiH-terminated oil | — | undercure | — |
| 14 | SiH-terminated oil | MSR-8000 (0.1 g) | colorless transparent | — |
| 15 | SiH-terminated oil | — | colorless, transparent | yellowing, deformed |
| 16 | SiH-terminated oil | MSR-8000 (0.1 g) | colorless, transparent | yellowing, crazing |

As seen from Table 2, all the silicon base polymer solutions remained fully miscible with the inorganic filler until the amount of silica reached 50 parts by weight relative to 100 parts by weight of net silicon base polymer content. By firing at 160° C., transparent or translucent cured products were formed except for Comparative Examples 9 and 11 which failed in providing strength after curing. On firing at 400° C., the cured products clouded, crazed or yellowed, and failed to maintain the desired shape.

Japanese Patent Application No. 2011-006288 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An optical material obtained by heat-curing an optical material-forming silicone resin composition at a temperature of at least 250° C.,
    said optical material-forming silicone resin composition comprising an inorganic filler which has been surface-treated with a silylating agent or silane coupling agent and a silicon base polymer obtained from dehydration reaction of a silicon base monomer comprising a hydrolyzable silane compound (A), wherein
    said hydrolyzable silane compound (A) has at least a pair of silicon atoms linked by a linking group which is a straight, branched or cyclic aliphatic hydrocarbon group of 1 to 6 carbon atoms or an aromatic ring-containing hydrocarbon group of 6 to 12 carbon atoms, said at least a pair of silicon atoms having attached thereto at least three substituent groups selected from hydrogen, hydroxyl and hydrolyzable groups, in total,
    said silicon base monomer contains at least 70 mol % on a silicon basis of the hydrolyzable silane compound (A),
    a proportion of aromatic structure-containing substituent groups in the substituent groups, inclusive of the linking group, on silicon atoms of the silicon base monomer is up to 30 mol % of the entire silicon-bonded substituent groups.

2. The optical material of claim 1, wherein said silane compound having at least a pair of silicon atoms linked by a linking group which is an aliphatic hydrocarbon group or an aromatic ring-containing hydrocarbon group, to which at least three substituent groups selected from hydrogen atoms, hydroxyl groups and hydrolyzable groups, in total, are attached, has the general formula (1):

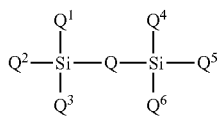

(1)

wherein

Q is a divalent, straight, branched or cyclic aliphatic hydrocarbon group of 1 to 6 carbon atoms or a divalent aromatic ring-containing hydrocarbon group of 6 to 12 carbon atoms, $Q^1$, $Q^2$, $Q^3$, $Q^4$, $Q^5$, and $Q^6$ are each independently hydrogen, halogen, hydroxyl, a straight, branched or cyclic alkoxy group of 1 to 10 carbon atoms, a straight, branched or cyclic alkyl group of 1 to 10 carbon atoms, or an aromatic ring-containing hydrocarbon group of 6 to 12 carbon atoms, at least one of $Q^1$, $Q^2$ and $Q^3$ and at least one of $Q^4$, $Q^5$ and $Q^6$ are selected from among hydrogen, halogen, hydroxyl, and a straight, branched or cyclic alkoxy group of 1 to 10 carbon atoms, and at least three of $Q^1$, $Q^2$, $Q^3$, $Q^4$, $Q^5$, and $Q^6$ are selected from among hydrogen, halogen, hydroxyl and a straight, branched or cyclic alkoxy group of 1 to 10 carbon atoms.

3. The optical material of claim 1, wherein said silicon base polymer comprises recurring units having the general formula (2) in an amount of at least 70 mol % based on the entire recurring units of the polymer,

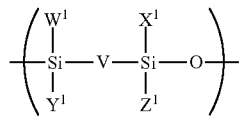

(2)

wherein

V is a divalent, straight, branched or cyclic aliphatic hydrocarbon group of 1 to 6 carbon atoms or a divalent aromatic ring-containing hydrocarbon group of 6 to 12 carbon atoms, $W^1$, $X^1$, $Y^1$ and $Z^1$ are each independently hydrogen, halogen, hydroxyl, a straight, branched or cyclic alkoxy group of 1 to 10 carbon atoms, a straight, branched or cyclic alkyl group of 1 to 10 carbon atoms, a monovalent aromatic ring-containing hydrocarbon group of 6 to 12 carbon atoms, or an oxygen atom to constitute an Si—O—Si crosslink, at least one of $W^1$, $X^1$, $Y^1$ and $Z^1$ being selected from among hydrogen, halogen, hydroxyl, an alkoxy group, a monovalent aromatic ring-containing hydrocarbon group of 6 to 12 carbon atoms, and an oxygen atom to constitute an Si—O—Si crosslink, and not all $W^1$, $X^1$, $Y^1$ and $Z^1$ are an oxygen atom to constitute an Si—O—Si crosslink.

4. The optical material of claim 1, wherein the inorganic filler is added in an amount of up to 1000 parts by weight per 100 parts by weight of the silicon base polymer.

5. The optical material of claim 1, wherein the inorganic filler is added in an amount of up to 100 parts by weight per 100 parts by weight of the silicon base polymer.

6. The optical material of claim 1, wherein the inorganic filler is added in an amount of up to 50 parts by weight per 100 parts by weight of the silicon base polymer.

* * * * *